(12) United States Patent
Falk et al.

(10) Patent No.: US 10,340,459 B2
(45) Date of Patent: Jul. 2, 2019

(54) TERAHERTZ DETECTION AND SPECTROSCOPY WITH FILMS OF HOMOGENEOUS CARBON NANOTUBES

(71) Applicant: INTERNATIONAL BUSINESS MACHINES CORPORATION, Armonk, NY (US)

(72) Inventors: Abram L. Falk, New Britain, CT (US); Damon B. Farmer, White Plains, NY (US); Shu-Jen Han, Cortlandt Manor, NY (US)

(73) Assignee: International Business Machines Corporation, Armonk, NY (US)

(*) Notice: Subject to any disclaimer, the term of this patent is extended or adjusted under 35 U.S.C. 154(b) by 256 days.

(21) Appl. No.: 15/077,025

(22) Filed: Mar. 22, 2016

(65) Prior Publication Data
US 2017/0279052 A1    Sep. 28, 2017

(51) Int. Cl.
 *C01B 32/17* (2017.01)
 *H01L 27/30* (2006.01)
 *H01L 51/00* (2006.01)
 *H01L 51/44* (2006.01)
 (Continued)

(52) U.S. Cl.
 CPC ........ *H01L 51/0048* (2013.01); *C01B 32/168* (2017.08); *C01B 32/17* (2017.08); *C01B 32/176* (2017.08); *H01L 27/305* (2013.01); *H01L 51/0003* (2013.01); *H01L 51/0021* (2013.01); *H01L 51/0025* (2013.01);
 (Continued)

(58) Field of Classification Search
 CPC ............ H01L 51/0048; H01L 51/0003; H01L 51/0021; H01L 51/0025; H01L 51/441; H01L 51/057; H01L 27/305; H01L 2251/301; H01L 2924/13061; C01B 31/028; C01B 2202/08; C01B 2202/22
 USPC ................... 250/338.4, 305, 338.1; 977/742
 See application file for complete search history.

(56) References Cited

U.S. PATENT DOCUMENTS 5,866,900 A * 2/1999 Jacobson ............... H04N 5/33
                                                        250/252.1
5,867,307 A * 2/1999 Myers .................. G02B 3/0031
                                                        250/351
(Continued)

FOREIGN PATENT DOCUMENTS

CN        102419212 B      1/2013
CN        103399349 A     11/2013
(Continued)

OTHER PUBLICATIONS

He, Xiaowei et al., "Carbon Nanotube Terahertz Detector", 2014, Nano Lett., vol. 14, pp. 3953-3958.*
(Continued)

*Primary Examiner* — David P Porta
*Assistant Examiner* — Blake C Riddick
(74) *Attorney, Agent, or Firm* — Tutunjian & Bitetto, P.C.; Vazken Alexanian (57) ABSTRACT

Detectors and methods of forming the same include aligning a semiconducting carbon nanotubes on a substrate in parallel to form a nanotube layer. The aligned semiconducting carbon nanotubes in the nanotube layer are cut to a uniform length corresponding to a detection frequency. Metal contacts are formed at opposite ends of the nanotube layer.

20 Claims, 6 Drawing Sheets

(51) Int. Cl.
*C01B 32/168* (2017.01)
*C01B 32/176* (2017.01)

(52) U.S. Cl.
CPC ........ *H01L 51/441* (2013.01); *C01B 2202/08* (2013.01); *C01B 2202/22* (2013.01); *H01L 2251/301* (2013.01)

(56) References Cited

U.S. PATENT DOCUMENTS

| | | | |
|---|---|---|---|
| 6,377,300 B1* | 4/2002 | Morris | H04N 17/002 250/252.1 |
| 6,566,704 B2* | 5/2003 | Choi | B82Y 10/00 257/213 |
| 7,063,753 B1* | 6/2006 | Chen | B82Y 10/00 148/108 |
| 7,547,881 B2 | 6/2009 | Hunt et al. | |
| 7,612,885 B2 | 11/2009 | Cole et al. | |
| 7,723,684 B1 | 5/2010 | Haddon et al. | |
| 8,148,688 B2 | 4/2012 | Kawano et al. | |
| 8,916,825 B1* | 12/2014 | Egerton | G01J 5/046 250/338.4 |
| 9,196,766 B1 | 11/2015 | Egerton et al. | |
| 9,212,950 B2 | 12/2015 | Xu et al. | |
| 9,327,979 B1* | 5/2016 | Gopalan | C01B 31/0253 |
| 2002/0067114 A1* | 6/2002 | Choi | B82Y 10/00 313/310 |
| 2002/0167375 A1* | 11/2002 | Hoppe | B82Y 10/00 333/186 |
| 2005/0184294 A1* | 8/2005 | Zhang | B82Y 10/00 257/77 |
| 2006/0261433 A1* | 11/2006 | Manohara | B82Y 10/00 257/471 |
| 2006/0273255 A1* | 12/2006 | Volkov | G01S 7/024 250/336.1 |
| 2008/0020487 A1* | 1/2008 | McLean | B82Y 30/00 438/1 |
| 2008/0251723 A1 | 10/2008 | Ward et al. | |
| 2009/0220408 A1* | 9/2009 | Lee | B82Y 30/00 423/447.2 |
| 2009/0267053 A1* | 10/2009 | Peng | B82Y 10/00 257/24 |
| 2009/0299213 A1* | 12/2009 | Patolsky | B82Y 10/00 600/554 |
| 2010/0050772 A1 | 3/2010 | Grosman et al. | |
| 2010/0051812 A1* | 3/2010 | Kawano | H01L 31/1035 250/338.2 |
| 2010/0171409 A1* | 7/2010 | Ando | B01J 35/002 313/311 |
| 2011/0174519 A1* | 7/2011 | Shah | H01B 3/004 174/119 C |
| 2011/0186775 A1* | 8/2011 | Shah | C08L 25/02 252/182.32 |
| 2011/0262772 A1* | 10/2011 | Hauge | B29C 43/22 428/688 |
| 2011/0315981 A1* | 12/2011 | Xu | G01J 5/02 257/43 |
| 2012/0126449 A1* | 5/2012 | Hart | B29C 70/14 264/220 |
| 2012/0231259 A1* | 9/2012 | Weisenberger | B01J 2/24 428/323 |
| 2012/0321785 A1* | 12/2012 | Rogers | B82Y 10/00 427/249.1 |
| 2013/0214244 A1* | 8/2013 | Sanborn | H01J 1/304 257/10 |
| 2014/0204372 A1* | 7/2014 | Pang | G01N 21/658 356/301 |
| 2014/0286852 A1* | 9/2014 | Nicholas | C01B 31/028 423/447.3 |
| 2014/0356411 A1* | 12/2014 | Fan | G01N 21/658 424/443 |
| 2015/0137414 A1* | 5/2015 | Shanov | B01J 37/12 264/176.1 |
| 2015/0311461 A1* | 10/2015 | Cola | H01L 51/0048 136/259 |
| 2015/0360949 A1* | 12/2015 | Wei | C01B 31/0253 264/28 |
| 2016/0054258 A1 | 2/2016 | Nicholas | |
| 2016/0099701 A1* | 4/2016 | Rinaldi | G01J 5/20 422/90 |
| 2016/0144401 A1* | 5/2016 | Carter | H01L 51/0012 428/179 |
| 2016/0178444 A1* | 6/2016 | Oulachgar | G01J 5/20 250/349 |
| 2016/0233426 A1* | 8/2016 | Arnold | H01L 51/0007 |
| 2017/0077407 A1* | 3/2017 | Maruyama | B82Y 30/00 |
| 2017/0096339 A1* | 4/2017 | He | C01B 31/0273 |
| 2017/0291817 A1* | 10/2017 | Rogers | C01B 31/026 |

FOREIGN PATENT DOCUMENTS

| | | |
|---|---|---|
| CN | 104075811 A | 10/2014 |
| CN | 102786023 B | 1/2015 |
| CN | 104777152 | 7/2015 |

OTHER PUBLICATIONS

Mistry, Kevin et al., "High-Yield Dispersions of Large-Diameter Semiconducting Single-Walled Carbon Nanotubes with Tunable Narrow Chirality Distributions", 2013, ACS Nano, 7 (3), pp. 2231-2239.*

Huczko, A., "Synthesis of aligned carbon nanotubes", 2002, Appl. Phys. A 4, pp. 617-638.*

Shekhar, Shashank et al., "Ultrahigh Density Alignment of Carbon Nanotube Arrays by Dielectrophoresis", 2011, ACS Nano, 5 (3), pp. 1739-1746.*

Li, X. et al., "Langmuir-Blodgett Assembly of Densely Aligned Single-Walled Carbon Nanotubes from Bulk Materials", 2007, J. Am. Chem. Soc., 129, pp. 4890-4891 & Suppl. S1-S5, DOI: 10.1021/ja071114e.*

Kim (Kim, Yeji et al., "Langmuir-Blodgett Films of Single-Wall Carbon Nanotubes: Layer-by-layer Deposition and Inplane Orientation of Tubes", 2003, Japanese Journal of Applied Physics, vol. 42, pp. 7629-7634) (Year: 2003).*

International Search Report for PCT/IB2017/050996 dated Jun. 15, 2017 (5 pages).

* cited by examiner

TERAHERTZ DETECTION AND SPECTROSCOPY WITH FILMS OF HOMOGENEOUS CARBON NANOTUBES

BACKGROUND

Technical Field

The present invention relates to terahertz spectroscopy and, more particularly, to the use of homogeneous semiconducting nanotubes in terahertz detectors and spectroscopes.

Description of the Related Art

The terahertz electromagnetic spectrum (e.g., infrared) is used for security, medical imaging, communication, and manufacturing. However, due to the short wavelengths involved, terahertz technologies, including sources, detectors, and optics, are relatively undeveloped.

SUMMARY

A method for forming a detector includes aligning a semiconducting carbon nanotubes on a substrate in parallel to form a nanotube layer. The aligned plurality of semiconducting carbon nanotubes in the nanotube layer are cut to a uniform length corresponding to a detection frequency. Metal contacts are formed at opposite ends of the nanotube layer.

A detector includes a layer of carbon nanotubes that are aligned in parallel and that have a uniform length. A first metal contact is formed in contact with a first side of the layer of carbon nanotubes. A second metal contact is formed in contact with a second side of the layer of carbon nanotubes, opposite to the first side.

A spectral detector includes a detector array having multiple individual detectors, each detector being tuned to a different respective frequency. Each detector includes a layer of carbon nanotubes that are aligned in parallel and that have a uniform length corresponding to the respective frequency of the detector. A first metal contact is formed in contact with a first side of the respective layer of carbon nanotubes. A second metal contact is formed in contact with a second side of the respective layer of carbon nanotubes, opposite to the first side.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention use carbon nanotubes as detectors in the terahertz region of the electromagnetic spectrum. Carbon nanotubes exhibit strong absorption in the terahertz range due to plasmonic resonances. The present embodiments arrange uniformly sized nanotubes between metal contacts and take advantage of the photothermoelectric effect to generate a signal when radiation at the resonant frequency strikes the nanotubes. The detectors described herein have high sensitivity at room temperature and, with multiple such detectors tuned to different respective frequencies, can provide spectral resolution. The present embodiments can provide detectors having peak detection frequencies anywhere in a range between about 1.5 THz and about 30 THz.

Figure 1:
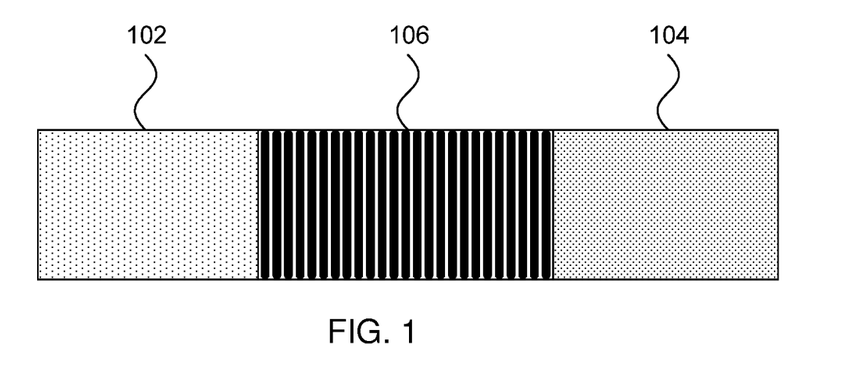
FIG. 1 is a diagram of a terahertz frequency radiation detector in accordance with the present principles.

Referring now to the drawings in which like numerals represent the same or similar elements and initially to FIG. 1, a top-down view of a terahertz detector 100 is shown. The detector 100 includes two metal contacts, including a first metal contact 102 formed from a first metal material and a second metal contact 104 formed from a second metal material. Between the two metal contacts is a layer of parallel semiconducting carbon nanotubes 106. The nanotubes in nanotube layer 106 have a uniform length provides an associated resonant frequency that determines what frequency of incoming radiation they are sensitive to. As shown, the nanotubes in nanotube layer 106 are oriented parallel and side-by-side between the metal contacts 102/104, with an axial orientation of the nanotubes being perpendicular to an axis connecting the two metal contacts 102/104.

When radiation is incident on the nanotube layer 106, the radiation induces a plasmon oscillation along the length of the carbon nanotubes, which heats the nanotube layer 106. Plasmons are light fields coupled to oscillating electrical charges on a surface. In confined systems, a plasmon's energy is quantized in a manner analogous to the description of quantized light in photons or quantized mechanical oscillations in phonons. Each nanotube therefore has a characteristic plasmon resonance frequency that is determined by its length, and this determines an associated electromagnetic frequency that couples to the plasmons at that characteristic frequency.

When the nanotube layer 106 is heated relative to the metal contacts 102 and 104, a photothermoelectric voltage is induced between the nanotube layer 106 and the metal contacts 102 and 104. The use of only semiconducting carbon nanotubes in the nanotube layer 106 (as opposed to including metallic carbon nanotubes) increases the photothermoelectric voltage.

First and second metal contacts 102 and 104 are formed from metals that have different work functions, giving the device a diode characteristic. As a result, the photothermoelectric voltage at the interfaces between the nanotube layer and the respective metal contacts 102 and 104 are different, such that the net photothermoelectric voltage across the entire detector 100, from the first metal contact 102 to the second metal contact 104, will be nonzero even when no bias voltage is applied. This voltage is measured between the two metal contacts 102 and 104 and represents the detection voltage.

Figure 2:
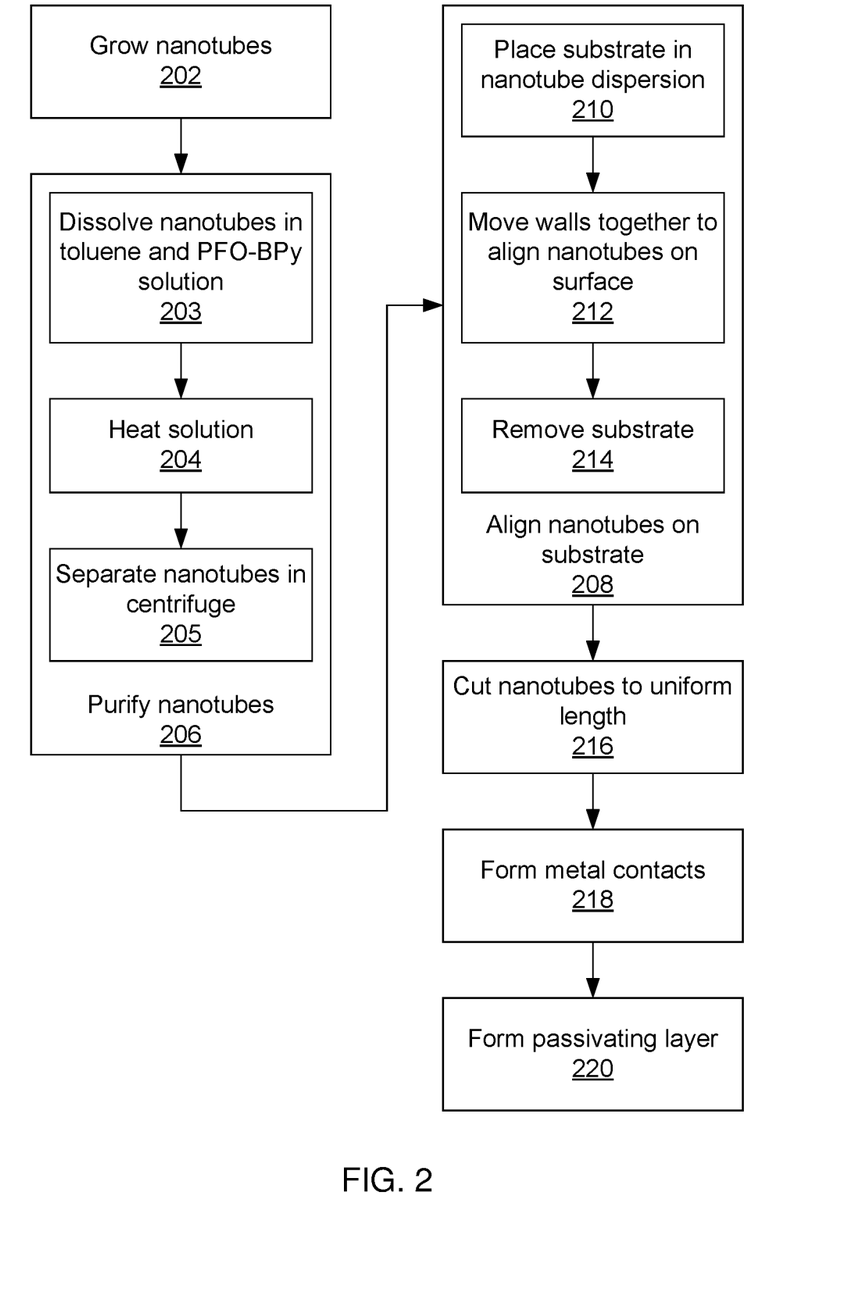
FIG. 2 is a block/flow diagram of a method of forming a terahertz frequency radiation detector in accordance with the present principles.

Referring now to FIG. 2, a method of forming a terahertz detector is shown. Block 202 grows a set of carbon nanotubes. The nanotubes may be grown by any appropriate process for forming these structures including, for example, chemical vapor deposition (CVD), laser deposition, and arch-discharge processes.

When carbon nanotubes are grown, they generally are formed in a proportion of roughly ⅓ metallic and ⅔ semiconductor structures, with the electrical characteristics of the nanotube depending on how a graphene sheet might be "rolled up" to represent the nanotube. In particular, nanotubes are described by a pair of indices, (m, n), with each index representing vectors along a graphene lattice. If n−m is divisible by 3, the resulting nanotube is metallic, whereas other nanotubes are semiconducting.

Because the photothermoelectric voltage produced by the nanotube layer 106 is stronger if the nanotubes are semiconducting, block 206 purifies the nanotubes. This is accomplished by separating the nanotubes in solution into a semiconducting solution and a metallic solution in block 203. In particular, the nanotubes may be placed into a solution of toluene and poly[(9,9-dioctylfluorenyl-2,7-diyl)-alt-co-(6,6'-{2,2'-bipyridine})] (known as PFO-BPy). The solution is heated in block 204 to about 80° C. for several minutes, causing the PFO-BPy to wrap around carbon nanotubes and disperse them into the toluene. The PFO-BPy exclusively selects semiconducting nanotubes, such that only the semiconducting nanotubes are dispersed. A centrifuge may then be used in block 205 to separate the semiconducting nanotubes from the metallic nanotubes in the solution.

After the semiconducting nanotubes have been purified, they are deposited onto a substrate to form films of aligned carbon nanotubes in block 208. The substrate can be formed from any appropriate flat, thermally insulating, and electrically insulating material such as a polyimide film. To deposit the nanotubes, the substrate is immersed in the purified nanotube dispersion, bounded by a well with movable walls. The edges of the walls are slowly moved together. As the walls move closer to one another, the nanotubes are pushed into alignment on the surface. Once they are aligned, the substrate is slowly lifted out of the dispersion, leaving a film of parallel-aligned nanotubes on the substrate. This leaves a few monolayers of nanotubes on the film and can be repeated multiple times to obtain thicker films of nanotubes.

Once the purified nanotubes are aligned, block 216 cuts the nanotubes to a uniform length. This sharpens the absorption spectrum of the nanotubes, making the detector 100 sensitive to a narrow range of frequencies. This may be accomplished using, e.g., reactive ion etching in oxygen and photolithographic or electron beam lithographic processes. If an electron beam lithographic process is used, the nanotube film is coated with, e.g., poly-methyl-methacrylate (PMMA), with stripes where the nanotube is to be etched being exposed by a scanning electron microscope. Development in a solution of isopropyl alcohol and water selectively dissolves the exposed polymer, exposing the surface of the nanotubes underneath. If photolithography is used instead, ultraviolet exposure substitutes for the electron beam exposure and a different polymer is used to define the regions of nanotubes to be cut.

A reactive ion etch in oxygen then etches away the exposed nanotube regions, after which the polymer is washed away by a solvent. By etching many stripes of nanotubes, the length of the nanotubes can be precisely set to anywhere in an exemplary range of about 5 nm to about 5 µm.

Block 218 forms metal contacts 102 and 104 that contact opposite edges of the nanotubes on nanotube layer 106. As noted above, the net thermoelectric power across the detector 100 is maximized when two different metals are used for the metal contacts 102 and 104. In one exemplary embodiment, palladium may be used for a p-type contact and scandium may be used for an n-type contact, but it should be understood that alternative metals may be employed instead. The regions of the first and second metal contacts 102 and 104 are defined by, e.g., photolithography, electron beam metal evaporation, and lift-off processes.

After formation of the metal contacts 102 and 104, block 220 forms a passivating layer using a dielectric material, for example aluminum oxide at a thickness of about 20 nm, to prevent oxidation of the detector surfaces and to enhance the stability of the detector 100.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 3:
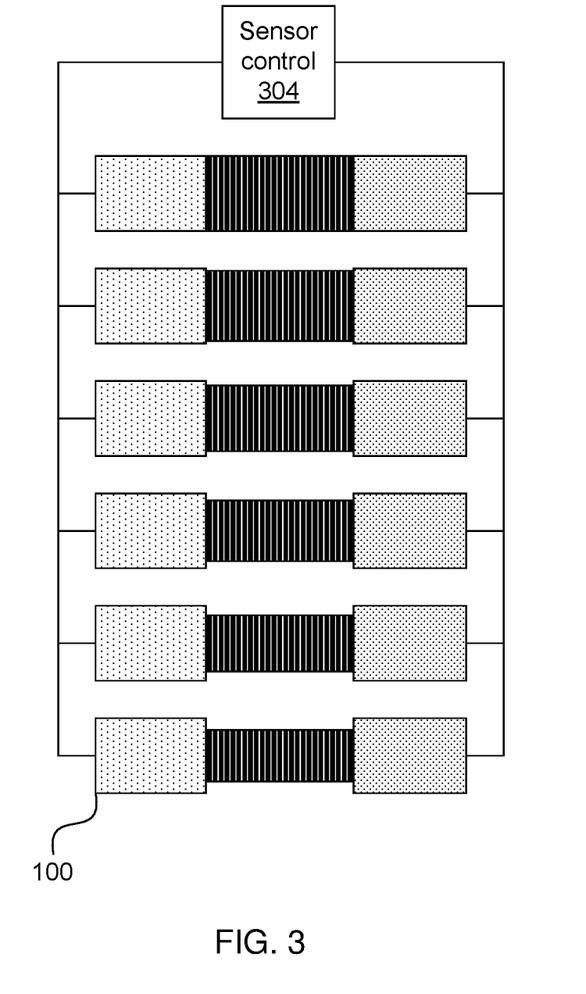
FIG. 3 is a diagram of an array of terahertz frequency radiation detectors in accordance with the present principles.

Referring now to FIG. 3, a detector array 300 is shown. The detector array 300 includes a number of individual detectors 100, each of which has a respective nanotube layer 106 with nanotubes of a different length. A sensor control system 304 monitors the voltage across the metal contacts 102 and 104 for each of the detectors 100 and associates each such output voltage with a respective frequency associated with the respective detector 100.

The detector array 300 provides spectral sensitivity. The plasmon resonance in carbon nanotubes characterizes a longitudinal charge oscillation that is coupled to a terahertz electromagnetic field. The resonance condition, corresponding to a charge oscillation undergoing a round-trip up and down the length of a nanotube, is sensitive to the nanotube length. In turn, the frequency of the plasmon resonance determines the peak frequency at which a detector 100 absorbs radiation. Therefore, by cutting the nanotubes into segments of, e.g., about 20 nm to about 5 µm, the frequency at which a particular detector 100 absorbs radiation is controlled. In addition, because the nanotubes are cut into uniform segments for each detector 100, the plasmon resonance of each detector 100 is sharper than that of unprocessed nanotubes.

Figure 4:
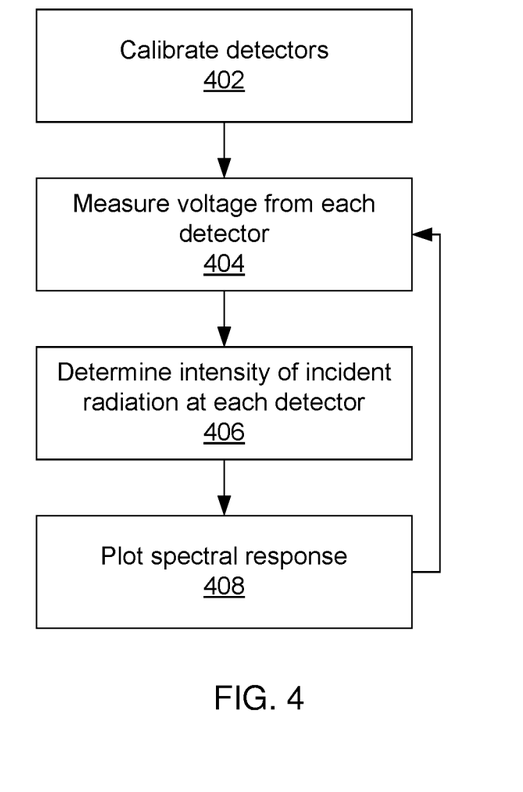
FIG. 4 is a block/flow diagram of a method of measuring a terahertz radiation spectrum in accordance with the present principles.

Referring now to FIG. 4, a method of terahertz spectral sensing is shown. Block 402 calibrates the detectors 402. In particular calibration is performed by sensor control system 304 and determines a voltage output by each detector 100 when exposed to a known intensity of radiation.

During operation, block 404 measures the voltage output from each detector 100 on the array 300. Block 406 then uses the calibration information from block 402 to determine a corresponding intensity radiation measured by each detector 100, making use of the fact that the voltage response of the detector 100 is generally linear except in the case of extremely intense radiation. Block 408 plots a spectral response for the array 300 by plotting the intensity measured by each detector 100 at a corresponding frequency, determined by the length of the nanotubes on each respective detector 100.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 5:
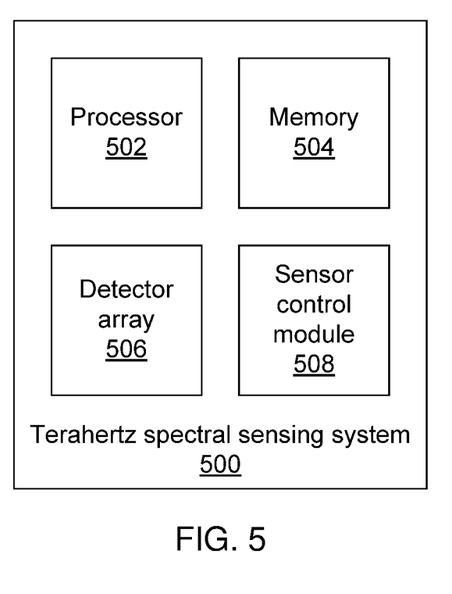
FIG. 5 is a block diagram of a terahertz spectral sensing system in accordance with the present principles.

Referring now to FIG. 5, a system 500 for terahertz spectral sensing is shown. The sensing system 500 includes a hardware processor 502 and memory 504. In addition, the sensing system 500 includes a detector array 506 that may be formed integrally with the sensing system 500 or may alternatively be a separate device with voltage read and control connections between it and the sensing system 500.

The sensing system 500 further includes sensor control module 508. The sensor control module 508 may be implemented as software that is stored in memory 504 and executed by processor 502. Alternatively, the sensor control module 508 may be implemented as one or more discrete hardware components in the form of, e.g., an application specific integrated chip or a field programmable gate array. The sensor control module 508 communicates with the detector array 506 and senses the voltages from each detector 100 in the detector array 506. The sensor control module 508 furthermore has the ability to calibrate the detector array 506 by sensing voltages under a controlled light intensity at known frequencies.

Figure 6:
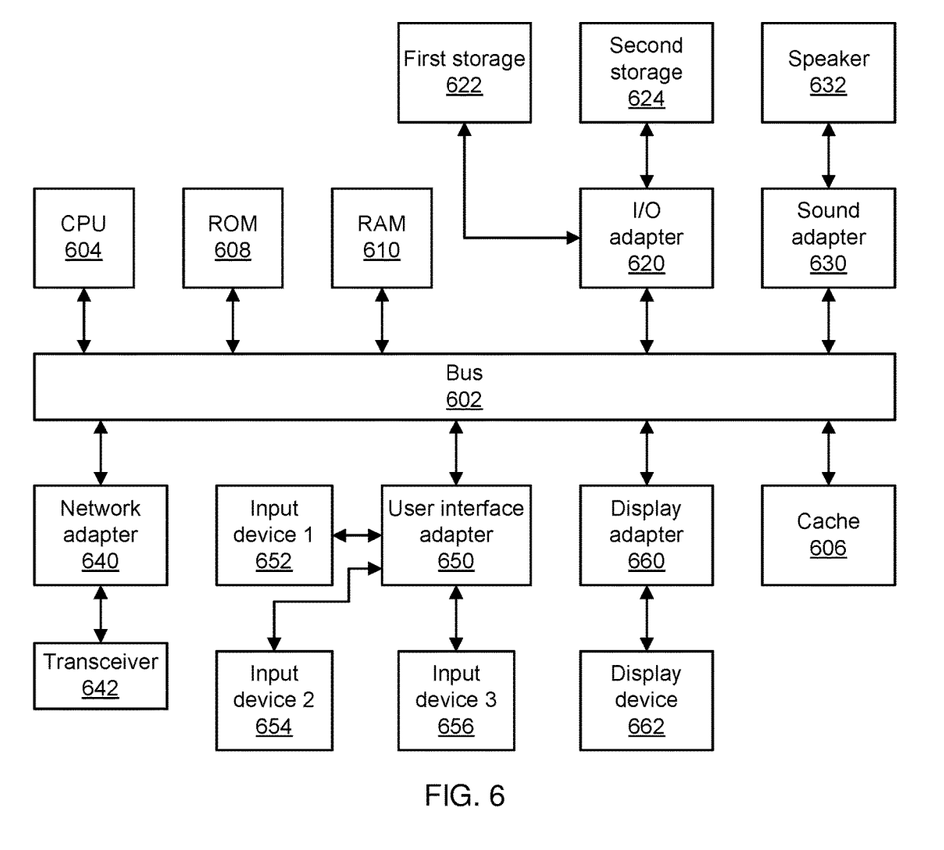
FIG. 6 is a block diagram of a processing system in accordance with the present principles.

Referring now to FIG. 6, an exemplary processing system 600 is shown which may represent the transmitting device 100 or the receiving device 120. The processing system 600 includes at least one processor (CPU) 604 operatively coupled to other components via a system bus 602. A cache 606, a Read Only Memory (ROM) 608, a Random Access Memory (RAM) 610, an input/output (I/O) adapter 620, a sound adapter 630, a network adapter 640, a user interface adapter 650, and a display adapter 660, are operatively coupled to the system bus 602.

A first storage device 622 and a second storage device 624 are operatively coupled to system bus 602 by the I/O adapter 620. The storage devices 622 and 624 can be any of a disk storage device (e.g., a magnetic or optical disk storage device), a solid state magnetic device, and so forth. The storage devices 622 and 624 can be the same type of storage device or different types of storage devices.

A speaker 632 is operatively coupled to system bus 602 by the sound adapter 630. A transceiver 642 is operatively coupled to system bus 602 by network adapter 640. A display device 662 is operatively coupled to system bus 602 by display adapter 660.

A first user input device 652, a second user input device 654, and a third user input device 656 are operatively coupled to system bus 602 by user interface adapter 650. The user input devices 652, 654, and 656 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 652, 654, and 656 can be the same type of user input device or different types of user input devices. The user input devices 652, 654, and 656 are used to input and output information to and from system 600.

Of course, the processing system 600 may also include other elements (not shown), as readily contemplated by one of skill in the art, as well as omit certain elements. For example, various other input devices and/or output devices can be included in processing system 600, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 600 are readily contemplated by one of ordinary skill in the art given the teachings of the present principles provided herein.

Having described preferred embodiments of terahertz detection and spectroscopy with films of homogeneous carbon nanotubes (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims:

The invention claimed is:

1. A method for forming a detector, comprising:
aligning a plurality of purified semiconducting carbon nanotubes on a substrate, in parallel, to form a stack of nanotube monolayers;
cutting the aligned plurality of semiconducting carbon nanotubes in the stack of nanotube monolayers to a uniform length corresponding to a detection frequency; and
forming metal contacts at opposite ends of the stack of nanotube monolayers.

2. The method of claim 1, further comprising:
growing a plurality of carbon nanotubes; and
purifying the plurality of carbon nanotubes so that only semiconducting nanotubes remain.

3. The method of claim 2, wherein purifying the carbon nanotubes comprises:
dissolving the carbon nanotubes in a solution with a selecting agent and heating the solution to bind the selecting agent only to semiconducting carbon nanotubes; and
separating the semiconducting carbon nanotubes from non-semiconducting carbon nanotubes in a centrifuge.

4. The method of claim 3, wherein the solution is toluene and the selecting agent is poly[(9,9-dioctylfluorenyl-2,7-diyl)-alt-co-(6,6'-{2,2'-bipyridine})].

5. The method of claim 1, wherein aligning the plurality of semiconducting carbon nanotubes comprises:
placing the substrate in a container holding a dispersion that includes the plurality of carbon nanotubes;
contracting walls of the container to align the plurality of carbon nanotubes in parallel; and
removing the substrate from the container to deposit a layer of parallel carbon nanotubes onto a surface of the substrate.

6. The method of claim 5, further comprising repeating said alignment to form a thicker stack of nanotube monolayers.

7. The method of claim 1, further comprising a dielectric layer over the metal contacts.

8. The method of claim 1, wherein aligning the plurality of semiconducting carbon nanotubes comprises arranging the plurality of semiconducting carbon nanotubes side-by side with an axial direction that is perpendicular to a shared axis of the first and second metal contacts.

9. A detector, comprising:
a stack of monolayers of purified semiconducting carbon nanotubes that are aligned in parallel and that have a uniform length;
a first metal contact in contact with a first side of the stack of monolayers of carbon nanotubes; and
a second metal contact in contact with a second side of the stack of monolayers of carbon nanotubes, opposite to the first side.

10. The detector of claim 9, wherein the carbon nanotubes are all semiconducting carbon nanotubes.

11. The detector of claim 9, wherein the first metal contact is formed from a metal that is different from a metal forming the second metal contact.

12. The detector of claim 11, wherein the first metal contact is formed from palladium and the second metal contact is formed from scandium.

13. The detector of claim 9, wherein the carbon nanotubes are arranged side-by-side with an axial direction that is perpendicular to a shared axis of the first and second metal contacts.

14. A spectral detector, comprising:
a detector array comprising a plurality of individual detectors, each detector being tuned to a different respective frequency, and each detector comprising:
a stack of monolayers of purified semiconducting carbon nanotubes that are aligned in parallel and that have a uniform length corresponding to the respective frequency of the detector;
a first metal contact in contact with a first side of each respective stack of monolayers of carbon nanotubes; and
a second metal contact in contact with a second side of each respective stack of monolayers of carbon nanotubes, opposite to the first side.

15. The spectral detector of claim 14, further comprising a sensor control module configured to read voltages from each of the individual detectors and to determine a spectral response across a range of frequencies.

16. The spectral detector of claim 15, wherein the sensor control module is further configured to read voltages from each of the individual detectors under radiation of known intensity to determine calibration for the detector array.

17. The spectral detector of claim 14, wherein the carbon nanotubes are all semiconducting carbon nanotubes.

18. The spectral detector of claim 14, wherein each first metal contact is formed from a metal that is different from a metal forming each second metal contact.

19. The spectral detector of claim 18, wherein each first metal contact is formed from palladium and each second metal contact is formed from scandium.

20. The spectral detector of claim 14, wherein the carbon nanotubes in each detector are arranged side-by-side with an axial direction that is perpendicular to a shared axis of the respective first and second metal contacts.

* * * * *